United States Patent
Singerl et al.

(10) Patent No.: US 7,606,539 B2
(45) Date of Patent: Oct. 20, 2009

(54) ADAPTIVE PREDISTORTER COUPLED TO A NONLINEAR ELEMENT

(75) Inventors: Peter Singerl, Villach (AT); Heinz Koeppl, Seebóden (AT)

(73) Assignee: Infineon Technologies AG, Munich (DE)

(*) Notice: Subject to any disclaimer, the term of this patent is extended or adjusted under 35 U.S.C. 154(b) by 619 days.

(21) Appl. No.: 11/500,107

(22) Filed: Aug. 7, 2006

(65) Prior Publication Data

US 2008/0032642 A1 Feb. 7, 2008

(51) Int. Cl.
*H04B 1/04* (2006.01)
*H03F 1/26* (2006.01)
*H04K 1/02* (2006.01)

(52) U.S. Cl. ........... 455/114.3; 455/63.1; 455/67.13; 455/115.1; 375/296; 375/297; 330/149

(58) Field of Classification Search ........... 455/114.3, 455/63.1, 67.13, 115.1, 117–118, 126, 114.2, 455/127.1, 127.2, 91; 375/296–297, 295, 375/284–285; 330/149–151

See application file for complete search history.

(56) References Cited

U.S. PATENT DOCUMENTS

| | | | |
|---|---|---|---|
| 7,136,628 B2* | 11/2006 | Yang et al. | 455/114.3 |
| 7,295,815 B1* | 11/2007 | Wright et al. | 455/91 |
| 7,469,491 B2* | 12/2008 | McCallister et al. | 375/296 |
| 2003/0058959 A1* | 3/2003 | Rafie et al. | 375/296 |
| 2004/0001559 A1* | 1/2004 | Pinckley et al. | 375/297 |
| 2004/0264596 A1* | 12/2004 | Vella-Coleiro | 375/297 |
| 2008/0096497 A1* | 4/2008 | Saed | 455/114.3 |
| 2008/0187035 A1* | 8/2008 | Nakamura et al. | 375/232 |
| 2008/0197925 A1* | 8/2008 | Furuta et al. | 330/149 |
| 2009/0054000 A1* | 2/2009 | Waheed et al. | 455/63.1 |
| 2009/0054016 A1* | 2/2009 | Waheed et al. | 455/114.3 |
| 2009/0111399 A1* | 4/2009 | Norris et al. | 455/114.3 |

OTHER PUBLICATIONS

"Adaptive Linearization Schemes for Weakly Nonlinear Systems Using Adaptive Linear and Nonlinear FIR Filters", Xiang Yang Gao and W. Martin Snelgrove, Proceedings of the IEEE Midwest Symposium on Circuits and Systems, Calgry, Canada, Aug. 1990, pp. 9-12.

"Digital Baseband Predistortion of Nonlinear Power Amplifiers Using Orthogonal Polynomials", Raviv Raich, Hua Qian and Tong Zhou, Proceedings of the IEEE International Conference of Acoustics, Speech and Signal Processing, Hong King, Apr. 2003, pp. 689-692.

(Continued)

*Primary Examiner*—Pablo N Tran
(74) *Attorney, Agent, or Firm*—Eschweiler & Associates, LLC

(57) ABSTRACT

In one embodiment, a circuit comprises an adaptive predistorter and a nonlinear element coupled to an output of the predistorter. The predistorter is operative to predistort an input signal according to predistortion control parameters at a given sampling rate. The circuit further comprises an identification unit and a translation unit. The identification unit identifies nonlinearity parameters representing the nonlinearity of the nonlinear element by sampling the output of the nonlinear element at an identification sampling rate lower than twice a bandwidth at the output of the nonlinear element. The translation unit translates the identified nonlinearity parameters into the predistortion control parameters. Other systems and methods are disclosed.

31 Claims, 3 Drawing Sheets

OTHER PUBLICATIONS

"Amplifier Linearization Using a Digital Predistorter with Fast Adaptation and Low Memory Requirements", James K. Cavers, IEEE Trans, on Vehicular Technology, vol. 39, Nov. 1990, pp. 374-382.
*Polynomial Signal Processing*, "Inversion and Time Serial Analysis", V.J. Mathews et al., New York; Wiley 2000, pp. 339-351.
"A Hammerstein Predistortion Linearization Design Based on the Indirect Learning Architecture", Lei Ding, Raviv Raich and G. Tong Zhou, Proceedings of the IEEE International Conference on Acoustics, Speech and Signal Processing, Orlando, Florida, May 2002, pp. 2689-2692.
"Sampling Requirement for Volterra System Identification", Walter A. Frank, IEEE Signal Process, Lett., vol. 3, Sep. 1996, pp. 266-268.
"A Low Rate Identification Method for Digital Predistorters Based on Volterra Kernel Interpolation", Peter Singerl and Heinz Koeppl, Proceedings of the IEEE Midwest Symposium on Circuits and Systems, Cincinnati, Ohio, Aug. 2005, 4 pgs.

"Nonlinear System Theory", Wilson J. Rugh, London: Johns Hopkins University Press, 1981, 38 pgs.
*The Volterra and Wiener Theories of Nonlinear Systems*, "The $p$th-Order Inverse", M. Schetzen, New York, Wiley, 1980, pp. 123-127.
"A 1.8V 450mW VDSL 4-Band Analog Front end IC in 0.18 μm CMOS", Hubert Weinberger, Andreas Wiesbauer, Martin Clara, Christian Fleischhacker, Thomas Potscher and Berthold Seger, Proceedings of the IEEE International Solid-State Circuits Conference, vol. 1, San Frandisco, California, Feb. 2002, 3 pgs.
ETSI TM "TS 101 270-1 V1.2.1 (Oct. 1999), VDSL Technical Specification, part 1: Functional requirements" European Telecommunications Standards Institute, 1999, 60 pgs.
Nonlinear System Identification-Input-Output Modeling Approach, Mathematical Modelling: Theory and Applications, vol. 1: Nonlinear System Parameter Identification, Robert Haber and László Keviczky, Kluwer Academic Publishers, 1999, pp. 14-20 and 43-48.

* cited by examiner

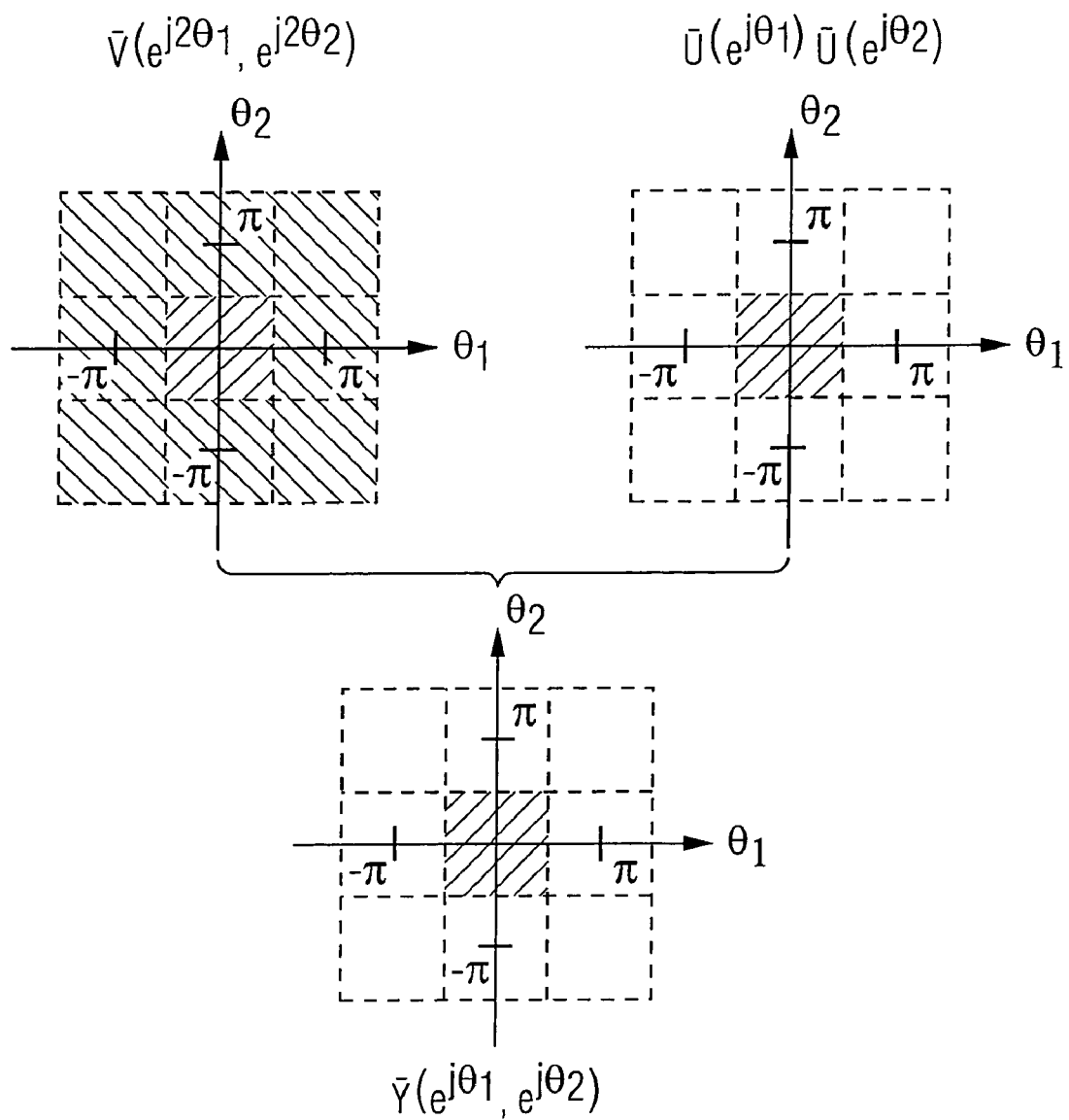

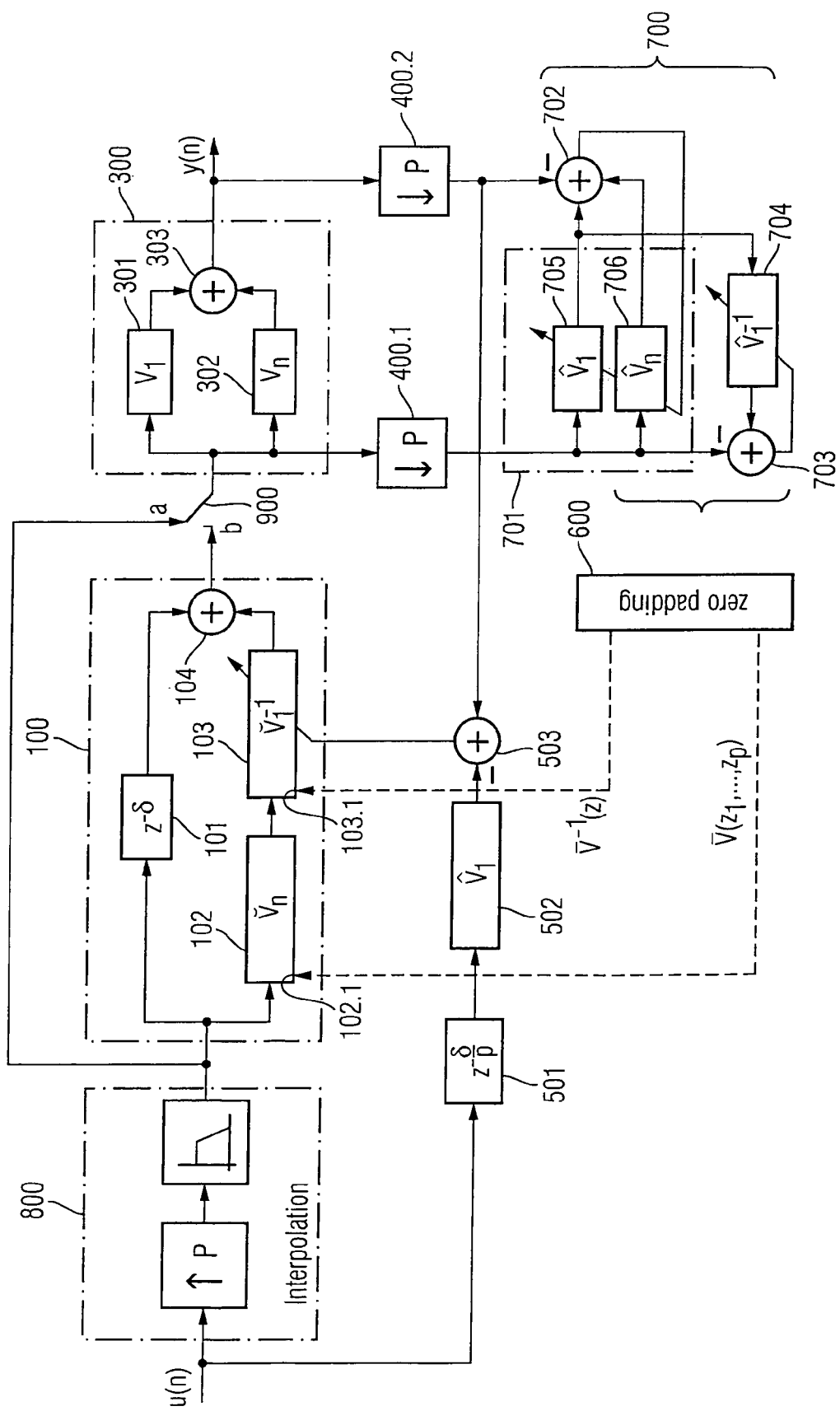

ADAPTIVE PREDISTORTER COUPLED TO A NONLINEAR ELEMENT

FIELD OF THE INVENTION

The invention relates to an adaptive predistorter coupled to a nonlinear element, and more particular to calculation of adaptive predistorter parameters linearizing a system comprising the adaptive predistorter and the nonlinear element.

BACKGROUND OF THE INVENTION

In many technical fields, linearization of a nonlinear element is used to compensate for unwanted effects caused by the nonlinear behaviour of the nonlinear element. One possibility to linearize a nonlinear element is to predistort the signal input into the nonlinear element to ensure that the output signal of the nonlinear element is, in the ideal case, linearly related to the input signal of the predistorter.

In general, such predistorter is a highly complex nonlinear system which incorporates memory. An important step in predistortion is the identification of the nonlinear element based on input-output measurements. Once the nonlinear element has been identified, it may prove possible to calculate appropriate predistorter parameters for linearization of the system containing the predistorter and the nonlinear element.

The technique of predistortion is widely used in modern wireline and wireless communication systems. Typically, communication systems employ a power amplifier with high output power requirements. Such power amplifiers are often driven in the nonlinear region to obtain the highest possible efficiency. This leads in general to spectral regrowth and intermodulation distortion in the signal band. Basically, there are two approaches to minimize these unwanted effects. The first one is the employment of an oversized power transistor which is purely driven in the linear range even for maximum output power requirements. This approach is highly cost intensive during production and also during operation because of the high price of such transistor and its low signal to DC efficiency. The second approach, signal predistortion, allows to create low price devices fulfilling a given spectral mask for the transmission signal even though the power amplifier is driven in the nonlinear region.

Identification of the nonlinear power amplifier or, more general, the nonlinear element is usually accomplished at a sufficiently high sampling rate to cover the information in the out-off-band region caused by the nonlinearity. Usually, the sampling frequency for identification of the nonlinear element is at least twice the bandwidth of the ouput signal, i.e. 2P-times higher than the signal bandwidth at the input of the nonlinear element, where the factor P denotes the highest odd-order nonlinearity of the nonlinear element. Because the nonlinear behaviour of the nonlinear element is generally unknown before identification, high sampling rates of a few hundreds of Msamples/s are used in communication applications.

According to a generalized sampling theorem, it is possible to uniquely identify a nonlinear element on a sampling frequency which is twice the input signal bandwidth or, in other words, which can satisfy the Nyquist theorem for the input signal of the nonlinear element.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

In one embodiment, the invention relates to a circuit that includes an adaptive predistorter to predistort an input signal according to a predistortion control parameter. A nonlinear element is coupled to an output of the predistorter, the output having a bandwidth. The circuit also includes an identification unit to identify a parameter representing the nonlinearity of the nonlinear element and to sample the output of the nonlinear element at an identification sampling rate lower than twice the bandwidth at the output of the nonlinear element. In addition, the circuit includes a translation unit to translate the parameter into the predistortion control parameter.

The following description and annexed drawings set forth in detail certain illustrative aspects and implementations of the invention. These are indicative of but a few of the various ways in which the principles of the invention may be employed.

BRIEF DESCRIPTION OF THE SEVERAL VIEWS OF THE DRAWINGS

Aspects of the invention are made more evident in the following detailed description of some embodiments when read in conjunction with the attached drawing figures, wherein:

FIG. 3 is one embodiment of a diagram illustrating two-dimensional zero-padding and spectral masking by a high rate input signal for a 2nd-order Volterra kernel, and FIG. 4 is a block diagram showing another embodiment of the invention.

DETAILED DESCRIPTION OF THE INVENTION

In the following description and claims, the term Volterra kernel is used. This term has a well defined meaning in nonlinear system theory. The concept of describing nonlinear systems in terms of Volterra kernels will not be explained in detail herein. For an intuitive understanding of the concept of Volterra kernels, it is to be noted that Volterra kernels are used to describe a nonlinear system in a similar way as the impulse response is used to describe a linear system. In linear system theory, the output signal of a linear system is the convolution of the input signal with the impulse response. Analogously, the output signal of a nonlinear system is the multi-dimensional convolution of the input signal with a series expansion of Volterra kernels. In fact, the first order Volterra kernel is identical to the impulse response of a linear system. As the concept of describing a system by an impulse response is limited to linear systems, the Volterra kernel representation may be intuitively understood as a generalization of the impulse response concept to nonlinear systems.

Figure 1:
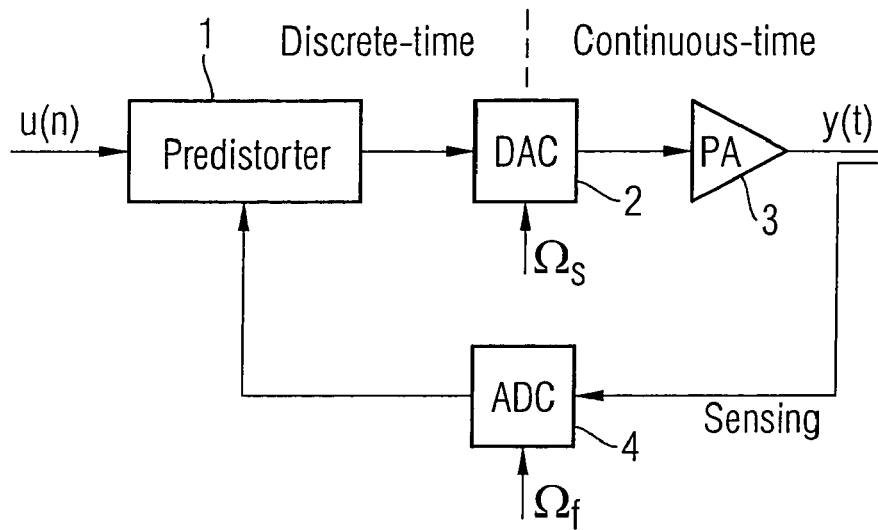
FIG. 1 is one embodiment of a block diagram of a communication transmitter with digital predistortion.

FIG. 1 depicts a simplified block diagram of a communication transmitter with digital predistortion. A digital input signal u(n) is input into an adaptive predistorter 1. The output of the predistorter 1 is fed into a digital-to-analog converter (DAC) 2 converting the input discrete time signal into an output continuous-time signal. This continuous-time signal is input into a power amplifier (PA) 3 to generate a high power analog output signal y(t).

The predistorter 1 acts on the digital input signal u(n) by a nonlinear operator which is in one embodiment the inverse of the nonlinearity of the power amplifier 3 to obtain an overall linear response. Because the nonlinear behavior of the power amplifier 3 is in general unknown, a feedback path is applied to identify the power amplifier 3 and to compute the inverse for the predistorter 1. The feedback path comprises an analog-to-digital converter (ADC) 4 for converting an output-sensed signal back into the discrete-time domain.

To compensate the out-off-band spectral components caused by the nonlinearity, the predistorter 1 can be operated at a sufficiently high sampling frequency $\Omega_s$, which is at least 2P-times higher than the transmission signal bandwidth B at the input of the power amplifier 3, where the factor P denotes the highest order of significant nonlinearity in the power amplifier 3. Therefore, the DAC 2 operates at the high sampling rate $\Omega_s$. On the other hand, the identification of a Volterra system—in FIG. 1 the nonlinear power amplifier 3—can be accomplished at a sampling rate that is just twice the bandwidth B of the input signal of the power amplifier 3. Therefore, according to the embodiment of the invention shown in FIG. 1, the sampling rate of the ADC 4 may be reduced to $\Omega_f = \Omega_s/P$. Thus, the Volterra kernels of the power amplifier 3 are identified at this lower sampling rate.

After Volterra kernel identification at low sampling rate $\Omega_f$, the identified Volterra kernels describing the nonlinear behaviour of the power amplifier 3 are used to find the correct setting of the predistorter 1. This step involves Volterra kernel upsampling.

Figure 2:
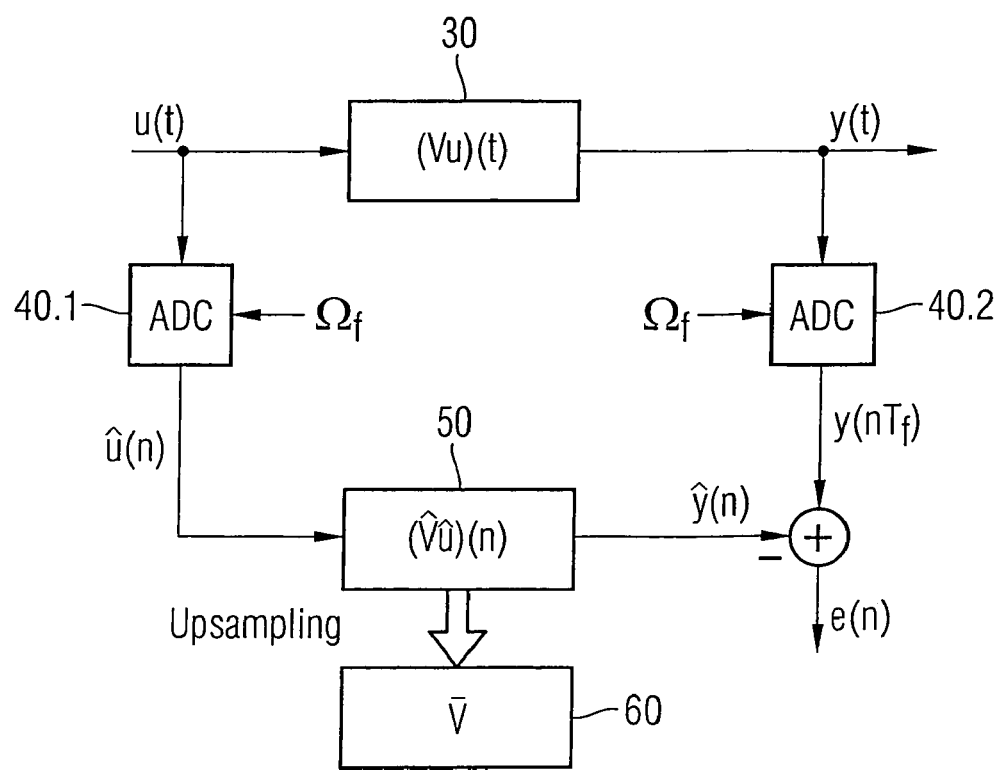
FIG. 2 is one embodiment of a diagram illustrating a system identification setup at a low-rate sampling frequency $\Omega_f$ and the generation of a high-rate operator $\nabla$ for predistortion and modeling purposes.

Volterra kernel identification and Volterra kernel upsampling are illustrated in FIGS. 2 and 3 and described below. The embodiments of the invention as well as the following description are not restricted to power amplifiers 3 as nonlinear elements. It can be assumed that the nonlinear element can be modeled by an additive decomposition of a dominant linear part and a perturbative nonlinear part. As the entire class of such weakly nonlinear systems may be modeled in terms of its Volterra series, a Volterra representation of the nonlinear element is used herein. However, all other approximate models for weakly nonlinear systems could also be used, including but not limited to: the Wiener model, Hammerstein model, and the "linear-nonlinear-linear" (LNL) structure.

The following notation and definitions are introduced. A continuous-time weakly nonlinear system 30, often representing nonlinear power amplifiers, will be referred to as the system V: u→y, with u, y ∈ $L_2(R_+)$, where $L_2(R_+)$ denotes the space of square integrable signals and $R_+$ is the set of positive reals. Its associated set of Laplace-domain Volterra kernels is $\{V(s_1, \ldots, s_p)\}$ with p=1, ..., P, where the order of homogeneity of a kernel is not given explicitly but can be read off from the number of its arguments.

A discrete-time Volterra model 50 operating at the Nyquist rate $\Omega_f$ of the input signal will be referred to as the low-rate model $\hat{V}:\hat{u}→\hat{y}$ with $\hat{u}, \hat{y} \in l_2(Z_+)$, where $l_2(Z_+)$ denotes the space of square summable infinite sequences and $Z_+$ is the set of positive integers. Its associated Z-transform kernels are $\{\hat{V}(z_1, \ldots, z_p)\}$ with p=1, ..., P. The ADCs 40.1 and 40.2 provide the input for the low-rate model $\hat{V}$ and correspond to ADC 4 in FIG. 1.

The upsampled version of the Volterra model 50 is discrete time upsampled Volterra model 60 operating at an integer multiple of $\Omega_f$, especially at the Nyquist rate of the output signal $\Omega_s$. It will be termed the upsampled model $\overline{V}:\overline{u}→\overline{y}$ with $\overline{u}, \overline{y} \in l_2(Z_+)$. Its associated Z-transform kernels are $\{\overline{V}(z_1, \ldots, z_p)\}$ with p=1, ..., P.

With a slight deviation from standard notation, but for the sake of conciseness and without loss of generality in case of band-limited input signals, it is associated with the system V its exact equivalent discrete-time system $l_2(Z_+) → l_2(Z_+)$ at $\Omega_s$ with kernels $\{V(z_1, \ldots, z_p)\}$. The following can be use in a frequency domain analysis, i.e., $s_k = j\Omega_k$ and $z_k = e^{j\theta_k}$ with k=1, ..., p and j being the imaginary unit.

Referring to kernel identification, one can find a low-rate model $\hat{V}$ reproducing exactly the sampled output $y(nT_f)$ of the system V with $T_f = 2\pi/\Omega_f$. This is depicted in FIG. 2, where minimizing $e(n) = y(nT_f) - \hat{y}(n)$ is a possibility to find that low-rate model $\hat{V}$.

Upsampling of the Volterra kernels $\{\overline{V}(z_1, \ldots, z_p)\}$ is performed by zero-padding without a following interpolation. The multidimensional zero-padding of Volterra kernels corresponds to a frequency scaling and to a periodic extension of $\{\hat{V}(z_1, \ldots, z_p)\}$. The kernels of the upsampled model are obtained by $\overline{V}(z_1, \ldots, z_p) = \hat{V}(z_1^P, \ldots, z_p^P)$. Thus, to upsample a Volterra model, one solely can replace each delay element $z^{-1}$ in the Volterra kernels by $z^{-P}$.

Note that the periodic extension implies that the kernels of the obtained upsampled model coincide with those of the system V over a limited frequency region, i.e., $\overline{V}(e^{j\theta_1}, \ldots, e^{j\theta_p}) = V(e^{j\theta_1}, \ldots, e^{j\theta_p})$ for $\theta_k \in [-\pi/P, \pi/P)$, with $\theta_k = 2\pi\Omega_k/\Omega_s$ and k=1, ..., p. But at the high rate, the interpolated input signal $\overline{U}(e^{j\theta})$ is nonzero for $\theta \in [-\pi/P, \pi/P)$, such that the system responses of $\overline{V}$ and V are identical. This process is illustrated for the response of a homogeneous $2^{nd}$-order Volterra system (P=2) in FIG. 3. $\overline{Y}$ is the z-transform of the upsampled model output signal $\overline{y}(t)$ and $\overline{U}$ is the z-transform of the upsampled model input signal u(t). The shaded areas in FIG. 3 represent the nonzero values of the frequency-domain kernels $\overline{V}$ and the frequency domain signals $\overline{Y}$ and $\overline{U}$ of the upsampled model, respectively.

FIG. 4 illustrates another embodiment of the invention. The circuit depicted in FIG. 4 comprises an interpolator 800 which upsamples and interpolates the input signal u(n). The P-times upsampled and interpolated input signal u(n) is input into a predistorter 100. The predistorter 100 has a simple predistoration architecture comprising the functional elements 101, 102, 103 and an adder 104. More specifically, the predistorter 100 comprises a parallel structure of a delay element 101 and a cascade of a purely nonlinear element 102 and a purely linear element 103. The nonlinear and linear characteristics of the elements 102 and 103 can be controlled by parameters received at the control inputs 102.1 and 103.1 of the elements 102, 103, respectively. The adder 104 sums the output of the delay element 101 and the output of the purely linear element 103.

The operation of the functional elements 101, 102, 103 can be expressed by operators. The delay element 101 applies the delay operation $z^{-\delta}$ with $\delta=nP$, $n \in Z_+$, the nonlinear element 102 applies the nonlinear part $V_n$ of an operator V and the linear element 103 applies the inverse of the linear part $V_1$ of the operator V. Thus, the overall function of the predistorter 100 can be expressed by the operator P with $$P = z^{-\delta} + \check{V}_1^{-1} \circ \check{V}_n, \quad (1)$$

where "○" denotes the composition of operators. The delay of δ samples is used to compensate the latency of the cascade $V_1^{-1} \circ V_n$. It is shown later under section "Mathematical Description of Predistorter Architecture" that this specific predistorter architecture is capable of linearizing the nonlinear element 300 when selecting a proper operator V and that the kernels of this proper operator V are given by $$\check{V}_1(z) = -V_1(z)z^\delta \text{ for } p=1 \text{ and} \qquad (2)$$

$$\check{V}_p(z_1, \ldots, z_p) = V_p(z_1, \ldots, z_p) \text{ for } p \geq 2. \qquad (3)$$

Returning to FIG. 4, the output of the predistorter 100 is coupled to the input of a nonlinear element 300 via a switch 900, if the switch 900 is in position b. If the switch 900 is in position a, the predistorter 100 is bypassed.

The nonlinear element 300 is modeled by a purely linear unit 301 represented by the linear part $V_1$, of the operator V, a nonlinear unit 302 represented by the nonlinear part $V_n$ of the operator V and an adder 303 adding the output of the linear and nonlinear units 301, 302. The adder 303 outputs the output signal y(n).

The input of the nonlinear element 300 is down-sampled in a down-sampling stage 400.1 by the factor P and the output of the nonlinear element 300 is down-sampled in a down-sampling stage 400.2 by the factor P. It is also possible that a smaller down-sampling factor than P is used. In any case, the sampling rate at the output of the down-sampling stages 400.1, 400.2 is lower than twice the bandwidth at the output of the nonlinear element 300.

The down-sampled signals are input into an identification unit such as a low-rate kernel identification stage 700. The low-rate kernel identification stage 700 can identify a nonlinearity parameter representing the nonlinearity of the nonlinear element 300 and sample the output of the nonlinear element at an identification sampling rate that is lower than twice the bandwidth at the output of the nonlinear element. The low-rate kernel identification stage 700 comprises a low-rate nonlinear element modeling unit 701. Further, it may comprise some circuitry (adder 702, adder 703 and unit 704) adapted to minimize a cost function over the nonlinearity parameter for the purpose of identifying the nonlinear element 300.

The low-rate nonlinear element modeling unit 701 comprises a linear stage 705 operating according to the linear part $\hat{V}_1$ of the low-rate model operator $\hat{V}$ and a nonlinear stage 706 operating according to the nonlinear part $\hat{V}_n$ of the low-rate model operator $\hat{V}$. The operation characteristics of both stages 705, 706 may be changed by adjusting parameters controlling the function of the respective stages 705, 706. As there are many different possibilities to parameterize the low-rate operator parts $\hat{V}_l$, $\hat{V}_n$, no specific parameterization is outlined here.

During the initial identification of the nonlinear element 300, the predistorter 100 is bypassed by setting the switch 900 in position a. Identification of the nonlinear element 300 means determination of the low-rate model operator $\hat{V}$, i.e. to find the set of parameters for the stages 705, 706 which set the characteristic of the low-rate nonlinear element modeling unit 701 to the low-rate model operator $\hat{V}$ reproducing exactly the sampled output $y(nT_f)$ of the nonlinear element operator V with $T_f = 2\pi/\Omega_f$. This may be accomplished by minimizing the cost function $$E = \sum_{m=m_1}^{m_2} |e[m]|^2 \to \min, \; e[m] = y[m] - \hat{y}[m], \qquad (4)$$

where y[m] is the decimated output signal of the nonlinear element 300 at the output of the down-sampling stage 400.2 and $\hat{y}[m]$ is the sum of the output signals of the linear and nonlinear stages 705, 706. In other words, the input parameters of the stages 705, 706 are varied until the output of the adder 702 reaches a minimum. Although one method has been described, it will be appreciated that other methods and especially other cost functions may be applied to identify the nonlinear element 300 in the low-rate nonlinear element modeling unit 701.

In order to obtain the parameters representing the inverse $\hat{V}_1^{-1}$ of the linear part $\hat{V}_1$ of the operator $\hat{V}$, input parameters of the inverse linear stage 704 are adjusted until the output of adder 703 reaches a minimum. Also here, other methods for obtaining the parameters representing the inverse of the linear part of the operator $\hat{V}$ are possible.

In one embodiment, a translation unit can translate a parameter representing the nonlinearity of the nonlinear element into a predistortion control parameter. The translation unit can comprise a transformation unit that is adapted to calculate parameters which are an upsampled representation of the identified nonlinearity parameter. The parameters calculated by the transformation unit can be calculated by applying a multi-dimensional zero padding in the time domain. In one embodiment, the translation unit includes an optimizing unit to calculate the predistortion control parameter by minimizing a second cost function over the parameters calculated by the transformation unit.

The low-rate identified operator $\hat{V}$ is used to calculate the input parameters for the nonlinear stage 102 and the inverse linear stage 103 of the predistorter 100. Calculation of these parameters is done by obtaining the kernels of the upsampled operator $\nabla$. As already described in connection with FIG. 2, the low-rate identified operator $\hat{V}$ can be recalculated to the high-rate operator $\nabla$ by a multi-dimensional zero padding. As zero padding in the time domain results in a simple frequency scaling in the frequency domain, this operation can be accomplished with almost no additional costs—each unit-sample delay is replaced by a P-sample delay according to $$\nabla(z_1, \ldots, z_p) = \hat{V}(z_1^P, \ldots, z_p^P). \qquad (5)$$

Then, the upsampled operator $\nabla$ is used in the predistorter 100 with $$\check{V}(z_1, \ldots, z_p) = \overline{V}(z_1, \ldots, z_p). \qquad (6)$$

It is to be noted that, although the upsampled operator $\nabla$ is able to reproduce the exact output of the system (i.e. of the operator V), the upsampled operator $\nabla$ generally does not perform in the same way when applied to the predistorter 100.

To see this, note that the kernels of the unsampled model (i.e. operator $\nabla$) and the nonlinear system (i.e. operator V) coincide over the bandwidth of the input signal $\overline{U}(e^{j\theta})$. The structure of the predistorter $P \equiv z^{-\delta} + V_1^{-1} \circ V_n$ reveals that, owing to the spectral regrowth of $V_n$, the linear operator $V_1^{-1}$ acts on a signal with a bandwidth that is in general P-times the input signal bandwidth. Thus, the output signal of the upsampled version of $V_1^{-1}$ differs from the correct version given in (2) and (3) by an amount that depends on the flatness of the linear frequency response of the system. The more flat the response is, the less is the effect of the periodic extension in the upsampled version outside the input signal bandwidth.

To correct for the periodic extensions of V(z), one can apply a low-rate adaptation, where the initialization is taken to be the upsampled response $\nabla(z)$. This optional low-rate adaptation is implemented by the delay stage 501, the linear stage 502 operating according to the linear part $\hat{V}_1$ of the operator $\hat{V}$ and the adder 503. The linear stage 502 may be identical to the linear stage 705 and uses the parameters obtained in the optimization process described above for low-rate identification of the linear element 300. The adaptation is performed by varying the characteristics of the inverse linear stage 103 (for instance by varying the parameters provides at the control input 103.1) until the output of the adder 503 settles at a minimum. Different to the optimization process used for low-rate identification of the linear element 300, this optimization is to be done with the switch 900 being in position b.

It is to be noted that the calculation of the predistorter parameters as described above by upsampling the nonlinear kernels of the low-rate identified nonlinear element 300 and copying these high-rate kernels into the predistorter 100 is generally not feasible for predistorter architectures.

With the applied predistortion architecture $P \equiv z^{-\delta} + V_1^{-1} \circ V_n$, as the operator $V_n$ with kernels $\{\overline{V}(z_1, \ldots, z_p)\}$, $p=2, \ldots, P$, operates on the input signal bandwidth, its response is identical to the response of $V_n$ with $\{V(z_1, \ldots, z_p)\}$ and thus requires no adaptation. This feature allows for efficient low-rate adaptive predistortion, where the few parameters of $V(z)$ need to be adapted, while the mass of parameters from the higher-order frequency responses requires no adaptation. This is in contrast to the application of the upsampled kernels $\{\overline{V}(z_1, \ldots, z_p)\}$ to the so-called $p^{th}$-order inverse predistorter architecture, which, for p=3, can be written, for instance, by the following expression $$\tilde{P} = z^{-\delta} \circ \{1 - V_1^{-1} \circ [V_2 \circ V_1^{-1} \circ V_2 + V_2 \circ (1 - V_1^{-1} \circ V_2) + V_3]\}. \quad (7)$$

In the case of upsampled kernels, every composition of operators where a nonlinear operator $V_k$ with k>1 is preceding one or more operators, an adaptation of all consecutive operators following $V_k$ is necessary to yield equivalent performance to a 3rd-order inverse utilizing the correct high-rate kernels of the system V.

The block diagram shown in FIG. 4 may be implemented in various circuits including purely digital systems or mixed signal systems. In digital systems, no analog-to-digital conversion is performed and therefore, the down-sampling stages 400.1 and 400.2 are decimation stages. In mixed signal systems as, for instance, shown in FIG. 1, the down-sampling stage 400.2 is implemented by an analog-to-digital converter corresponding to the ADC 4 shown in FIG. 2. In this case, the DAC 2 (cf. FIG. 1) would be implemented between the switch 900 and the input of the nonlinear element 300. Thus, the down-sampling stage 400.1 would still be in the digital domain and does not need to be replaced by another ADC.

Further, it is to be noted that for purely digital systems as well as for mixed signal systems, the nonlinear element 300 could be implemented by virtually any nonlinear circuitry and is not restricted to amplifiers. In addition, although described and illustrated as a hardware structure, the functionality and features of the present system can also be performed by appropriate software routines or a combination of hardware and software. Thus, the present invention should not be limited to any particular implementation.

As a practical implementation, the nonlinear element 300 may be a power amplifier for a VDSL (Very High Data Rate Digital Subscriber Line) analog front-end transmitter device that complies with the distortion ratios of the VDSL standard Band Plan 998. To be able to apply predistortion over a realistic distortion range, such circuit was miss-tuned to yield a harmonic distortion ratio of 40 dB. The operator V has been obtained by fitting a simple $5^{th}$-order Volterra model to the I/O measurement of a transistor-level circuit simulation. The standard 4-band VDSL system can utilize a bandwidth of up to 12 MHz, where each band is DMT (Discrete Multi-Tone Modulation) modulated. The frequency allocation for this simulation according to the standard Band Plan 998 comprises two downstream bands with bandwidth of each 2.59 MHz, located at center frequencies 2.225 MHz and 6.885 MHz. According to the above, the sampling rate of the digital predistortion for this system can be at least $\Omega_s = 2\pi \times 81.8$ MHz. Conventionally, this directly translates to the sampling rate of the ADC 4 in the feedback path used for the parameterization of the predistorter. The proposed approach can use an ADC sampling rate of $\Omega_f = 2\pi \times 16.36$ MHz resulting in a cost efficient implementation of such circuitry.

Mathematical Description of Predistorter Architecture

First, it is shown that the predistorter architecture depicted in FIG. 4 and defined in equation (1) is capable of linearizing a nonlinear element 300 modeled by the operator V.

The composition of the predistorter 100 and the nonlinear element is given by the expression $$L \equiv (V_1 + V_n) \circ (z^{-\delta} + \check{V}_1^{-1} \circ \check{V}_n). \quad (8)$$

This expression yields a linearization if $\|V_n\| << \|V_1\|$ with $\check{V}_1 = -z^{\delta} \circ V_1$ and $\check{V}_n = V_n$, where the operator norm corresponds to the signal norm with $\|V_1\| \equiv \sup_{\|u\| \leq 1} \|V_1 u\|$. Qualitatively this becomes clear by decomposing (8) as $$L = z^{-\delta} \circ V_1 + V_1 \circ \check{V}_1^{-1} \circ \check{V}_n + V_n \circ (z^{-\delta} + \check{V}_1^{-1} \circ \check{V}_n), \quad (9)$$

where it is used that the delay operator commutes with all time-invariant operators. The above assumption on weak nonlinearity implies $\|V_n \circ V_1^{-1} \circ V_n\| << \|V_n\|$, such that the last term in (9) may be approximated by $V_n \circ (z^{-\delta} + V_1^{-1} \circ V_n) \approx V_n \circ z^{-\delta}$. Thus, the overall system response is rendered as $L \approx z^{-\delta} \circ V_1$, i.e. is linear.

Second, a quantitative analysis of the linearization performance of the predistorter 100 is provided by employing the Volterra series representation of the involved operators.

The set of Volterra kernels of V is denoted by $\{V(z_1, \ldots, z_p)\}$ with $p=1, \ldots, P$. The set of kernels $\{L(z_1, \ldots, z_p)\}$ for $p=0, 1, 2, \ldots, P^2$ of L is expressed in terms of the kernels of the operators according to the decomposition in (9). For clarity of presentation, we indicate the order of homogeneity of a Volterra kernel by an additional subscript in the following derivation. Allowing for non-minimum phase systems with $V_1(z)\check{V}_1^{-1}(z) = z^{-\delta}$, the application of the Z-domain cascade rule for discrete-time Volterra series to (9) yields $$L_p(z_1, \ldots, z_p) = \qquad (10)$$

$$\sum_{n=1}^{p} \underbrace{\sum_{m_1=1} \cdots \sum_{m_n=1}}_{\omega(n)=p} \left[ V_n(z_1 \cdots z_{\omega(1)}, \ldots, z_{\alpha(n)} \cdots z_{\omega(n)}) \times \prod_{k=1}^{n} \check{V}_1^{-1}(z_{\alpha(k)} \cdots z_{\omega(k)}) \check{V}_{m_k}(z_{\alpha(k)}, \ldots, z_{\omega(k)}) \right]$$

with the lower and upper index bound functions $$\alpha(k) \equiv \alpha(m_1, \ldots, m_{k-1}) = 1 + \sum_{j=1}^{k-1} m_j \text{ with } \alpha(1) = 1 \text{ and}$$

$$\omega(k) \equiv \omega(m_1, \ldots, m_k) = \sum_{j=1}^{k} m_j,$$

respectively.

Separating terms in (10) for n=1 and n=p gives $$L_p(z_1, \ldots, z_p) = V_1(z_1 \cdots z_p)\check{V}_1^{-1}(z_1 \cdots z_p) \times \check{V}_p(z_1, \ldots, z_p) + \qquad (11)$$

$$V_p(z_1, \ldots, z_p)(z_1 \cdots z_p)^{-\delta} +$$

-continued $$\sum_{n=2}^{p-1}\underbrace{\sum_{m_1=1}\cdots\sum_{m_n=1}}_{\omega(n)=p}\left[V_p(z_1\cdots z_{\omega(1)},\ldots,z_{\alpha(n)}\cdots z_{\omega(n)})\times\right.$$

$$\left.\prod_{k=1}^{n}\check{V}_1^{-1}(z_{\alpha(k)}\cdots z_{\omega(k)})\check{V}_{m_k}(z_{\alpha(k)},\ldots,z_{\omega(k)})\right]$$

where the first two summands in (11) equalize if the linear frequency domain kernel is $V_1(z) = -V_1(z)z^\delta$ as already noted in (2) and the kernels for $p \geq 2$ are $V_p(z_1, \ldots, z_p) = V_p(z_1, \ldots, z_p)$ as already noted in (3).

In conclusion, the system with an adjusted predistorter 300 results in the following Volterra kernels $$L_1(z_1) = V_1(z)z^{-\delta} \qquad (12)$$

$$L_2(z_1, z_2) = 0$$

$$L_3(z_1, z_2, z_3) = -[V_2(z_1z_2, z_3)V_1^{-1}(z_1z_2)V_2(z_1, z_2) +$$

$$V_2(z_1, z_2z_3)V_1^{-1}(z_2z_3)V_2(z_2, z_3)](z_1z_2z_3)^{-\delta}$$

$$\vdots$$

$$L_p(z_1, \ldots, z_p) =$$

$$-\sum_{n=2}^{p}\underbrace{\sum_{m_1=1}\cdots\sum_{m_n=1}}_{\omega(n)=p}\left[V_n(z_1\cdots z_{\omega(1)},\ldots,z_{\alpha(n)}\cdots z_{\omega(n)})\right.$$

$$\prod_{k=1}^{n}(z_{\alpha(k)}\cdots z_{\omega(k)})^{-\delta}\times\check{V}_1^{-1}(z_{\alpha(k)},\ldots,z_{\omega(k)})$$

$$\left.V_{m_k}(z_{\alpha(k)},\ldots,z_{\omega(k)})\right]$$

Although "perfect" equalization is possible for the $2^{nd}$-order Volterra kernel $L_2(z_1, z_2)$, the resulting distortion of the predistorted non-linear element output signal is much lower compared to the non-compensated non-linear element output signal if $\|V_n\| << \|V_1\|$ because all the kernels $L_p(z_1, \ldots, z_p)$ for $p \leq 3$ in (12) incorporate the multiplicative inverse of the linear kernel $V_1(z)$.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A circuit comprising:
an adaptive predistorter to predistort an input signal according to a predistortion control parameter,
a nonlinear element coupled to an output of the predistorter, the output having a bandwidth,
an identification unit to identify a nonlinearity parameter representing the nonlinearity of the nonlinear element and to sample the output of the nonlinear element at an identification sampling rate lower than twice the bandwidth at the output of the nonlinear element, and
a translation unit to translate the nonlinearity parameter into the predistortion control parameter.

2. The circuit according to claim 1, wherein:
the adaptive predistorter comprises a parallel structure of a delay stage and a cascade of an adaptive nonlinear stage and an adaptive linear stage.

3. The circuit according to claim 2, wherein:
the delay stage causes a P-sample delay, where P is the ratio of the sampling rate of the adaptive predistorter to the identification sampling rate.

4. The circuit according to claim 1, wherein:
the identification unit is adapted to calculate the nonlinearity parameter by minimizing a first cost function over the nonlinearity parameter.

5. The circuit according to claim 1, wherein:
the translation unit comprises a transformation unit adapted to calculate parameters which are an upsampled representation of the identified nonlinearity parameter.

6. The circuit according to claim 5, wherein:
the parameters calculated by the transformation unit are calculated by applying a multi-dimensional zero padding in the time domain.

7. The circuit according to claim 5, wherein:
the translation unit comprises an optimizing unit to calculate the predistortion control parameter by minimizing a second cost function over the parameters calculated by the transformation unit.

8. The circuit according to claim 1, comprising:
a digital-to-analog converter coupled between the predistorter and the nonlinear element.

9. The circuit according to claim 1, comprising:
an analog-to-digital converter coupled between the output of the nonlinear element and the identification unit.

10. The circuit according to claim 9, wherein:
the analog-to-digital converter is adapted to operate at the identification sampling rate.

11. The circuit according to claim 1, wherein:
the nonlinear element is a power amplifier.

12. A circuit, comprising:
an adaptive predistorter to predistort an input signal according to predistortion control parameters, and
a nonlinear element coupled to an output of the predistorter,
wherein the predistortion control parameters are calculated by identifying nonlinearity parameters representing the nonlinearity of the nonlinear element by sampling the output of the nonlinear element at an identification sampling rate lower than twice the bandwidth at the output of the nonlinear element, and translating the identified nonlinearity parameters into the predistortion control parameters.

13. The circuit according to claim 12, wherein:
the adaptive predistorter comprises a parallel structure of a delay stage and a cascade of an adaptive nonlinear stage and an adaptive linear stage.

14. A circuit comprising:
means for adaptively predistorting an input signal according to predistortion control parameters, and
means for nonlinearly processing a signal, an input of which being coupled to an output of the means for adaptively predistorting the input signal,
wherein the means for adaptively predistorting the input signal comprises a parallel structure of a delay stage and a cascade of an adaptive nonlinear stage and an adaptive linear stage.

15. The circuit according to claim 14, further comprising:
means for identifying nonlinearity parameters representing nonlinearity of the means for nonlinearly processing the signal to sample an output of the means for nonlinearly processing the signal at an identification sampling rate lower than twice a bandwidth at the output of the means to nonlinearly processing a signal.

16. The circuit according to claim 15, further comprising:
means for translating the identified nonlinearity parameters into the predistortion control parameters.

17. The circuit according to claim 16, wherein:
the predistortion control parameters are calculated by applying a multi-dimensional zero padding in the time domain to the identified nonlinearity parameters.

18. A method to calculate predistortion control parameters of an adaptive predistorter coupled to an input of a nonlinear element, comprising:
identifying nonlinearity parameters representing nonlinearity of the nonlinear element by sampling an output of the nonlinear element at an identification sampling rate lower than twice a bandwidth at the output of the nonlinear element, and
translating the identified parameters into the predistortion control parameters.

19. The method according to claim 18, wherein:
the predistortion control parameters control a predistorter comprising a parallel structure of a delay stage and a cascade of an adaptive nonlinear stage and an adaptive linear stage.

20. The method according to claim 19, wherein:
the predistorter operates at a given sampling rate, and
the delay stage causes a P-sample delay, where P is a ratio of the given sampling rate to the identification sampling rate.

21. The method according to claim 18, wherein:
the identified nonlinearity parameters are calculated by minimizing a first cost function over the nonlinearity parameters.

22. The method according to claim 18, wherein:
the translating step comprises calculating transformed parameters which are an upsampled representation of the identified nonlinearity parameters.

23. The method according to claim 22, wherein:
the transformed parameters are calculated from the identified nonlinearity parameters by applying a multi-dimensional zero padding in the time domain.

24. The method according to claim 22, further comprising:
calculating the predistortion control parameters by minimizing a second cost function over transformed parameters calculated in the translating step.

25. The method according to claim 18, wherein:
the nonlinear element is an analog element, and
sampling the output of the nonlinear element is accomplished by an analog-to-digital converter operating at the identification sampling rate.

26. A method to produce a linearized signal output from a nonlinear element coupled to the output of an adaptive predistorter, comprising:
identifying parameters representing Volterra kernels of the nonlinear element by sampling the output of the nonlinear element at an identification sampling rate lower than twice a bandwidth at the output of the nonlinear element,
translating the identified parameters into predistortion control parameters, and
inputting the predistortion control parameters into the adaptive predistorter.

27. The method according to claim 26, wherein:
the predistortion control parameters control a predistorter comprising a parallel structure of a delay stage and a cascade of an adaptive nonlinear stage and an adaptive linear stage.

28. The method according to claim 26, wherein:
the predistorter operates at a given sampling rate, and
the delay stage causes a P-sample delay, where P is the ratio of the given sampling rate to the identification sampling rate.

29. The method according to claim 26, wherein:
the identified parameters representing Volterra kernels of the nonlinear element are calculated by minimizing a first cost function over these parameters.

30. The method according to claim 26, wherein:
the translating comprises calculating transformed parameters representing Volterra kernels which are upsampled Volterra kernels of the nonlinear element.

31. The method according to claim 30, wherein:
the transformed parameters are calculated from the identified parameters by applying a multi-dimensional zero padding in-the time domain.

* * * * *